US007482841B1

(12) United States Patent
Nguyen et al.

(10) Patent No.: US 7,482,841 B1
(45) Date of Patent: Jan. 27, 2009

(54) DIFFERENTIAL BANG-BANG PHASE DETECTOR (BBPD) WITH LATENCY REDUCTION

(75) Inventors: Toan Thanh Nguyen, Santa Clara, CA (US); Thungoc M. Tran, San Jose, CA (US)

(73) Assignee: Altera Corporation, San Jose, CA (US)

( * ) Notice: Subject to any disclaimer, the term of this patent is extended or adjusted under 35 U.S.C. 154(b) by 41 days.

(21) Appl. No.: 11/731,463

(22) Filed: Mar. 29, 2007

(51) Int. Cl.
*H03D 13/00* (2006.01)

(52) U.S. Cl. .............................. 327/3; 327/12; 327/142; 327/145

(58) Field of Classification Search .................... 327/2, 327/3, 8–10, 12, 142, 144, 145, 153, 161
See application file for complete search history.

(56) References Cited

U.S. PATENT DOCUMENTS

| | | | | |
|---|---|---|---|---|
| 5,150,364 | A | * | 9/1992 | Negus ......................... 370/542 |
| 5,483,540 | A | * | 1/1996 | Okamura ..................... 370/542 |
| 6,621,307 | B1 | * | 9/2003 | Younis et al. ................. 327/12 |
| 7,209,525 | B2 | * | 4/2007 | Laturell et al. ............... 375/316 |

OTHER PUBLICATIONS

R.C. Walker, "Designing Bang-Bang PLLs for Clock and Data Recovery in Serial Data Transmission Systems," *Phase-Locking in High Performance Systems-From Devices to Architectures*, B. Razavi, (Eds.), IEEE Press, 2003, pp. 34-45.

* cited by examiner

*Primary Examiner*—An T Luu
(74) *Attorney, Agent, or Firm*—Ropes & Gray LLP; Robert R. Jackson

(57) ABSTRACT

Bang-bang phase detection (BBPD) methods and circuits are presented for providing low latency, low jitter phase detection for use in high data-rate applications. A shortened data-path implementation of BBPD methods and circuits provides low-latency production of two output signals including alternating samples of the input signal. Combinational logic circuitry is also provided to produce a clock-data recovery (CDR) signal indicative of the phase of the input signal with respect to a clock signal. The use of differential signals throughout the BBPD timing circuitry provides for the production of a low jitter CDR signal.

19 Claims, 5 Drawing Sheets

DIFFERENTIAL BANG-BANG PHASE DETECTOR (BBPD) WITH LATENCY REDUCTION

BACKGROUND OF THE INVENTION

This invention relates to differential bang-bang phase detection (BBPD) methods and circuits having reduced latency. Methods and circuits are provided to improve the performance of BBPD circuits at high data rates.

The transmission of data at high data rates increasingly depends on the performance of the clock data recovery (CDR) that is used to recover the transmitted data signal from the received signal. High performance CDR circuitry is essential to accurately extract timing information from high-frequency signals and to recover the transmitted data signal from the received signal. In many digital communications applications and circuits, the performance of the CDR circuitry used in the application limits the operating frequency and data-rate of the communication circuit. Improved CDR circuitry is therefore needed in order to increase the data-rate and operating frequency of the communications applications.

The use of bang-bang phase detector circuits allows the VCO to run at one-half the frequency of the data signal. The use of BBPD circuits thereby allows communications applications to run substantially faster than the VCOs their operation depends on. However, the BBPD circuits themselves operate at the full data-rate of the received signal, and have therefore become the bottleneck of the communications applications. In order to operate at very high data-rates, BBPD circuits must output well-balanced up and down pulses to a charge pump used to regulate the VCO control voltage level. BBPD circuits must also operate with minimal jitter and with minimal latency.

It is an object of the present invention to provide improved bang-bang phase detection methods and circuits for use in high-speed, high data-rate communications applications.

SUMMARY OF THE INVENTION

Bang-bang phase detection (BBPD) methods and circuits for high data-rate applications are presented. The methods and circuits may be used to improve the performance of bang-bang phase detection circuits, including deserializer circuits and clock data recover (CDR) circuits operating at high frequencies and high data-rates.

Methods and circuits for performing bang-bang phase detection in high data-rate applications are provided, the methods and circuits producing two BBPD output signals each including alternating samples of a BBPD input signal. A first set of re-timed samples of the input signal are produced using a first stage of timing circuitry including first, second, third, and fourth flip-flops, each flip-flop receiving at its input the BBPD input signal, and each flip-flop being clocked by a different phase of a common clock signal. A second set of re-synchronized samples of the input signal are produced using a second stage of timing circuitry including first, second, third, fourth, fifth, and sixth flip-flops, each flip-flop having an input coupled to an output of a flip-flop of the first stage of timing circuitry and a differential output. The first and third flip-flops of the second stage produce at their respective outputs first and second BBPD output signals, wherein the first and second BBPD output signals include alternating samples of the BBPD input signal.

In some embodiments, a set of XOR output signals are produced using a first stage of combinational logic circuitry including first, second, third, and fourth exclusive-OR ("XOR") gates, each XOR gate receiving at its inputs two differential output signals of flip-flops of the second stage of timing circuitry and producing at its output an XOR output signal. Output clock lead/lag signals are produced, the lead/lad signals indicating whether the phase of the common clock signal is leading or lagging the phase of the BBPD input signal. The lead/lag signals are produced using a second stage of combinational logic circuitry including first and second OR gates, each OR gate receiving at its inputs two of the XOR output signals, the first and second OR gates producing at their outputs the clock lead/lag signals.

Further features of the invention, its nature and various advantages, will be more apparent from the accompanying drawings and the following detailed description.

DETAILED DESCRIPTION

Figure 1:
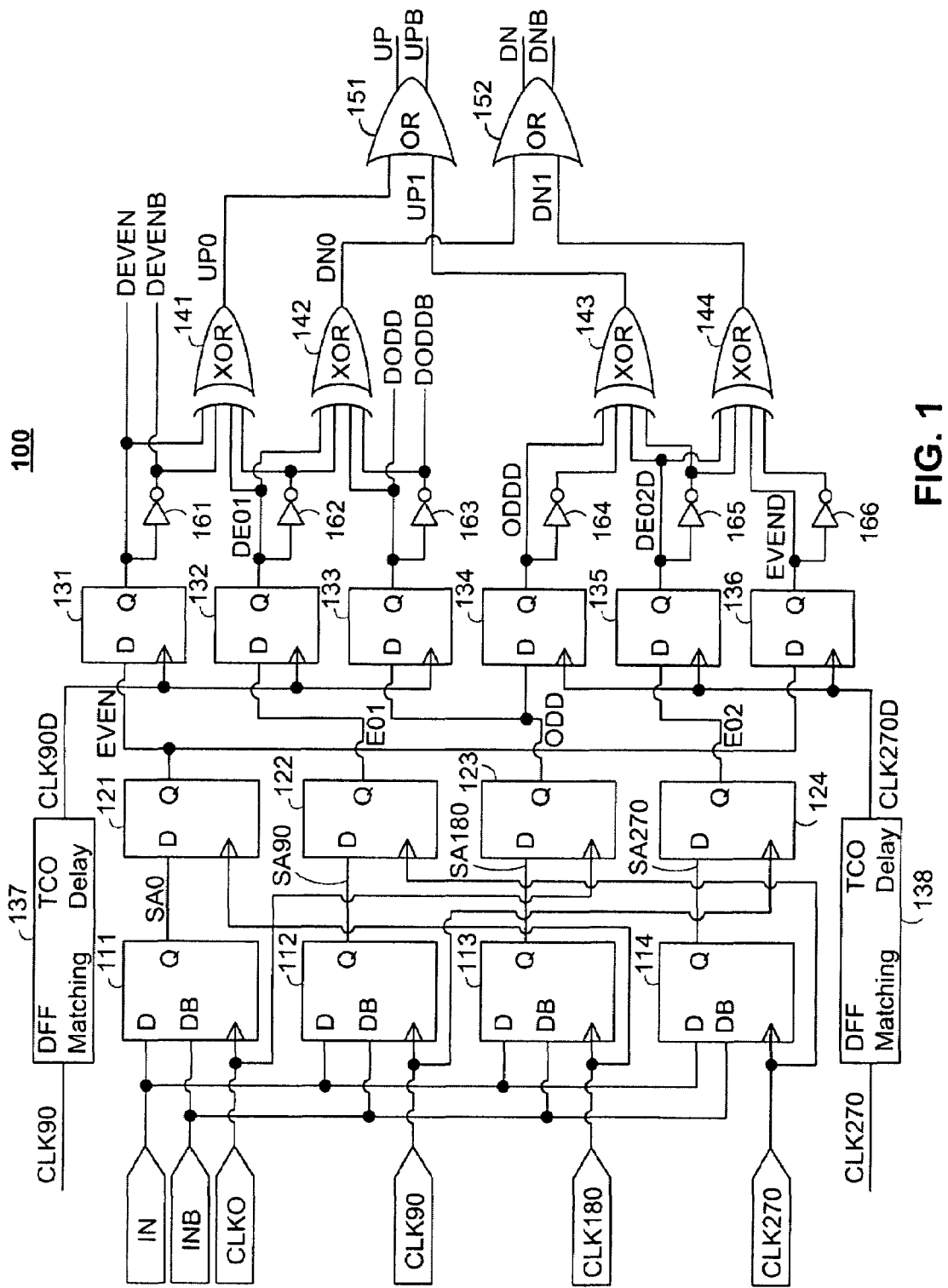
FIG. 1 shows a schematic diagram of a bang-bang phase detector in accordance with the principles of the invention.

FIG. 1 shows a schematic diagram of a bang-bang phase detector (BBPD) circuit 100 including first, second and third stages of timing circuitry and first and second stages of combinational logic circuitry. BBPD circuit 100 produces from differential input signals IN/INB received at differential input nodes two sets, UP/UPB and DN/DNB, of differential output signals used to detect the phase of the input signals. BBPD circuit 100 receives four clock signals CLK0, CLK90, CLK180, and CLK270 for timing, and produces two additional delayed clock signals CLK90D and CLK270D.

BBPD circuit 100 also functions as a differential input sampler that produces two sets, DEVEN/DEVENB and DODD/DODDB, of retimed differential output signals. The first retimed differential output signal, DEVEN/DEVENB, includes the even samples of the input signal (samples 2, 4, . . . ), and the second differential output signal, DODD/DOODB, includes the odd samples of the input signal (samples 1, 3, . . . ). Both output signals DEVEN and DODD have data rates equal to half of the input signal data rate.

The operation of BBPD circuit 100 uses four clock signals CLK0, CLK90, CLK180, and CLK270. The four clock signals generally correspond to four different phases of a single clock signal. In such embodiments, the four clock phases have the same frequency and the CLK90 signal lags the CLK0 signal by a quarter period, the CLK180 signal lags the CLK0 signal by a half period, and the CLK270 signal lags the CLK0 signal by three quarters of a period. Clock signals CLK0, CLK90, CLK180, and CLK270 have the same pulse width as the input data signal IN/INB. The clock signals therefore have a frequency that is equal to one-half the data-rate of the input data signal IN/INB.

BBPD circuit 100 includes three stages of timing circuitry followed by two stages of combinational logic circuitry. A first stage of timing circuitry includes four differential flip-flops 111-114 used as sense-amplifiers. Each flip-flop receives the input signals IN/INB at differential inputs, and produces a single-ended output signal. Flip-flops 111-114 are respectively timed by one of the four clock signals CLK0, CLK90, CLK180, CLK270. The first stage of timing circuitry is operative to capture variable amplitude input signals and boost them to full-rail output signals. The first stage of timing circuitry may, for example, be operative to receive input signals IN/INB with 5 mV amplitude and boost the input signals to full-rail signals having, for example, 1.5V amplitudes. Other input and full-rail voltage levels may be used.

A second stage of timing circuitry includes four single-ended flip-flops 121-124 used to re-sample the input signals. Each flip-flop receives at its input the output signal of the corresponding flip-flop of the first stage of circuitry. For example, the input of flip-flop 121 is coupled to the output of flip-flop 111. Similarly, the inputs of flip-flops 122-124 are coupled, respectively, to the outputs of corresponding flip-flops 112-114. The flip-flops of the second stage are timed using a clock signal that is delayed by a half-period relative to the clock signal used for timing of the corresponding flip-flop of the first stage. Flip-flop 121 is therefore clocked by the CLK180 clock signal, flip-flop 122 by CLK270, flip-flop 123 by CLK0, and flip-flop 124 by CLK90.

A third stage of timing circuitry includes six single-ended flip-flops 131-136 used to re-synchronize the data signals using two delay clocks CLK90D and CLK270D for phase comparison and data output to the deserializer. Each flip-flop receives at its input the output signal of one of the flip-flops from the second stage of timing circuitry. The inputs of flip-flops 131 and 136 are coupled to the output of flip-flop 121, the input of flip-flop 132 is coupled to the output of flip-flop 123, the inputs of flip-flops 133 and 134 are coupled to the output of flip-flop 123, and the input of flip-flop 135 is coupled to the output of flip-flop 124. Flip-flops 131-133 are timed using the first delay clock signal CLK90D. Flips-flops 134-136 are timed using the second delay clock signal CLK270D.

Input clock signals CLK90 and CLK270 are fed through matching delays 137 and 138, respectively, to produce the delayed clock signals CLK90D and CLK270D. Matching delays 137 and 138 are timed so as to compensate for the tco (clock to output delay) of flip-flops 121-124 of the second stage of timing circuitry. The matching delays ensure that flip-flops 131-136 latch the signals received at their respective input nodes after those signals have stabilized. As such, the matching delays ensure that flip-flops 131-136 latch the signals received at their respective input nodes after the signals at the outputs of flip-flops 121-124 have stabilized. The output of each of flip-flops 131-136 is coupled to an inverter 161-166 operative to produce a differential signal from the single-ended signal at the output flip-flops 131-136. The differential signal at the outputs of flip-flops 131-136 and inverters 161-166 are fed to the first stage of combinational circuitry.

The first stage of combinational circuitry includes four exclusive-OR ("XOR") logic gates 141-144 receiving differential signals at their inputs and producing single-ended logic signals at their respective outputs. A first XOR gate 141 receives the differential outputs of flip-flop 131 at a first set of inputs, and the differential outputs of flip-flop 132 at a second set of inputs. Second XOR gate 142 receives the differential outputs of flip-flops 132 and 133 at its first and second sets of inputs, respectively. Third XOR gate 143 receives the differential outputs of flip-flops 134 and 135 at its first and second sets of inputs, respectively. Fourth XOR gate 144 receives the differential outputs of flip-flops 135 and 136 at its first and second sets of inputs, respectively. The outputs of XOR gates 141-144 serve as inputs to the second stage of combinational logic circuitry.

The second stage of combinational circuitry includes two OR logic gates 151-152. OR gate 151 receives at its inputs the output signals of XOR gates 141 and 143, and produces a differential output signal UP/UPB. OR gate 152 receives at its inputs the output signals of XOR gates 142 and 144, and produces a differential output signal DN/DNB.

BBPD circuit 100 is operative to produce two sets UP/UPB and DN/DNB of differential output signals used to detect the phase of the input signals. The UP/UPB and DN/DNB signals are produced, respectively, at the differential output nodes of OR gates 151 and 152. The UP/UPB and DN/DNB signals may be used as input signals to a charge pump operative to adjust the phase of clock signals CLK0, CLK90, CLK180, and CKL270 in order to match the phase of the clock signals to that of input signal IN/INB.

Input signal IN/INB and the clock signals are in phase when transitions in the input signal are synchronized with rising edges in the clock signals. If a transition in input signal IN/INB occurs during the time-interval between a rising edge in signal CLK0 and the immediately following rising edge in signal CLK90 (interval I1), or during the time-interval between a rising edge in signal CLK180 and the immediately following rising edge in signal CLK270 (interval I3), signal UP will go HIGH and signal DN will remain LOW to indicate that the clock signal lags the input signal. If no transitions in the input signal occur during either of intervals 11 and 13, signals UP and DN will remain in their previous states (UP=High, DN=LOW). Similarly, if a transition in input signal IN/INB occurs during the time-interval between a rising edge in signal CLK90 and the immediately following rising edge in signal CLK180 (interval I2), or during the time-interval between a rising edge in signal CLK270 and the immediately following rising edge in signal CLK0 (interval I4), signal DN will go HIGH and signal UP will remain LOW to indicate that the clock signal leads the input signal. If no transitions in the input signal occur during either of intervals 12 and 14, signals UP and DN will remain in their previous states (DN=High, UP=LOW). During periods in which there are no transitions in input signal IN/INB, both signals UP and DN remain LOW.

BBPD circuit 100 is also operative to produce two sets DEVEN/DEVENB and DODD/DODDB of retimed differential output signals. The first retimed differential output signal DEVEN/DEVENB is produced at the differential output of flip-flop 131 and corresponding inverter 161. Signal DEVEN/DEVENB includes the even samples of the input signal (samples 0, 2, . . . ). The second retimed differential output signal DODD/DODDB is produced at the differential output of flip-flop 133 and corresponding inverter 163. Signal DODD/DODDB includes the odd samples of the input signal (samples 1, 3, . . . ). Both retimed output signals DEVEN/DEVENB and DODD/DODDB operate at half of the input signal frequency and include alternating samples of the input signal IN/INB.

Figure 3:
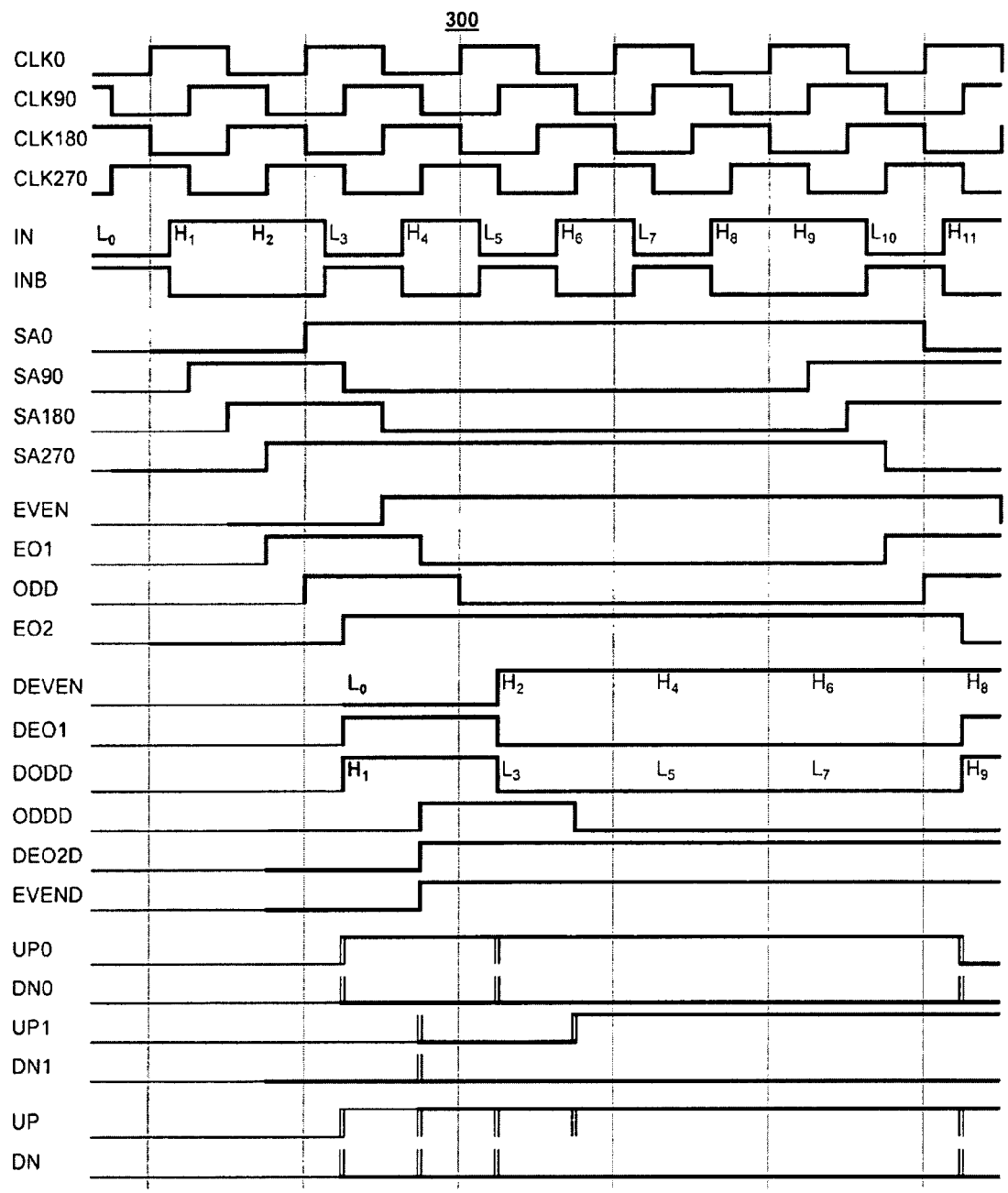
FIG. 3 shows an illustrative timing diagram showing the operation of the circuit of FIG. 1.

FIG. 3 shows an illustrative timing diagram 300 illustrating the operation of BBPD circuit 100. Timing diagram 300 shows the operation of circuit 100 in response to an illustrative differential input signal IN/INB and to input clock signals CLK0, CLK90, CLK180, and CLK270. Each signal shown in timing diagram 300 corresponds to the signal traveling on the identically named line in circuit 100. Each signal is shown as a thin line when the signal is in an undetermined state (e.g., when the circuit is starting up), and as a solid line when the signal is in a determined state.

Timing diagram 300 shows the operation of circuit 100 under ideal operating conditions in which the timing circuitry has negligible propagation delay and the delayed clock signals CLK90D and CLK270D have the same phase as clock signals CLK90 and CLK270. Timing diagram 300 shows the operation of the circuitry under conditions in which inverters 161-166 have a non-negligible delay which gives rise to jitter in the output signals of the stages of combinational logic circuitry. Jitter in the output signals is illustratively shown in the timing diagrams by double vertical lines, as shown, for example, in the timing traces of signals UP0, DN0, UP1, DN1, UP, and DN or diagram 300.

The data-rate of input signal IN of timing diagram 300 is twice the frequency of clock signal CLK0. The input signal is illustratively depicted as a series of logic LOW (L) and logic HIGH (H) states, each sample of the input signal being sequentially numbered. Corresponding samples of the output signals DEVEN and DODD have the same logic value (H/L) and sample number as the corresponding input data sample.

As shown in FIG. 3, each even sample of the input signal propagates to the DEVEN output at least one-and-a-quarter clock periods after the input signal has stabilized at the input of the circuitry (i.e., after at least the delay between a rising edge in CLK0 and the rising edge in CLK90D that occurs at least one-and-a-quarter clock periods later). Similarly, each odd sample of the input signal propagates to the DODD output at least three-quarters of a clock period after the input signal has stabilized at the input of the circuitry (i.e., after at least the delay between a rising edge in CLK180 and the following rising edge in CLK90D).

FIG. 3 additionally shows jitter occurring in the UP and DN output signals of the combinational logic stages of circuit 100. The jitter results from the propagation delay of signals through inverters 161-166. The propagation delay causes the signals at the outputs of flip-flops 131-136 and the complements of those signals at the outputs of inverters 161-166 to be momentarily equal and to cause jitter in the outputs of XOR gates 141-144.

Figure 2:
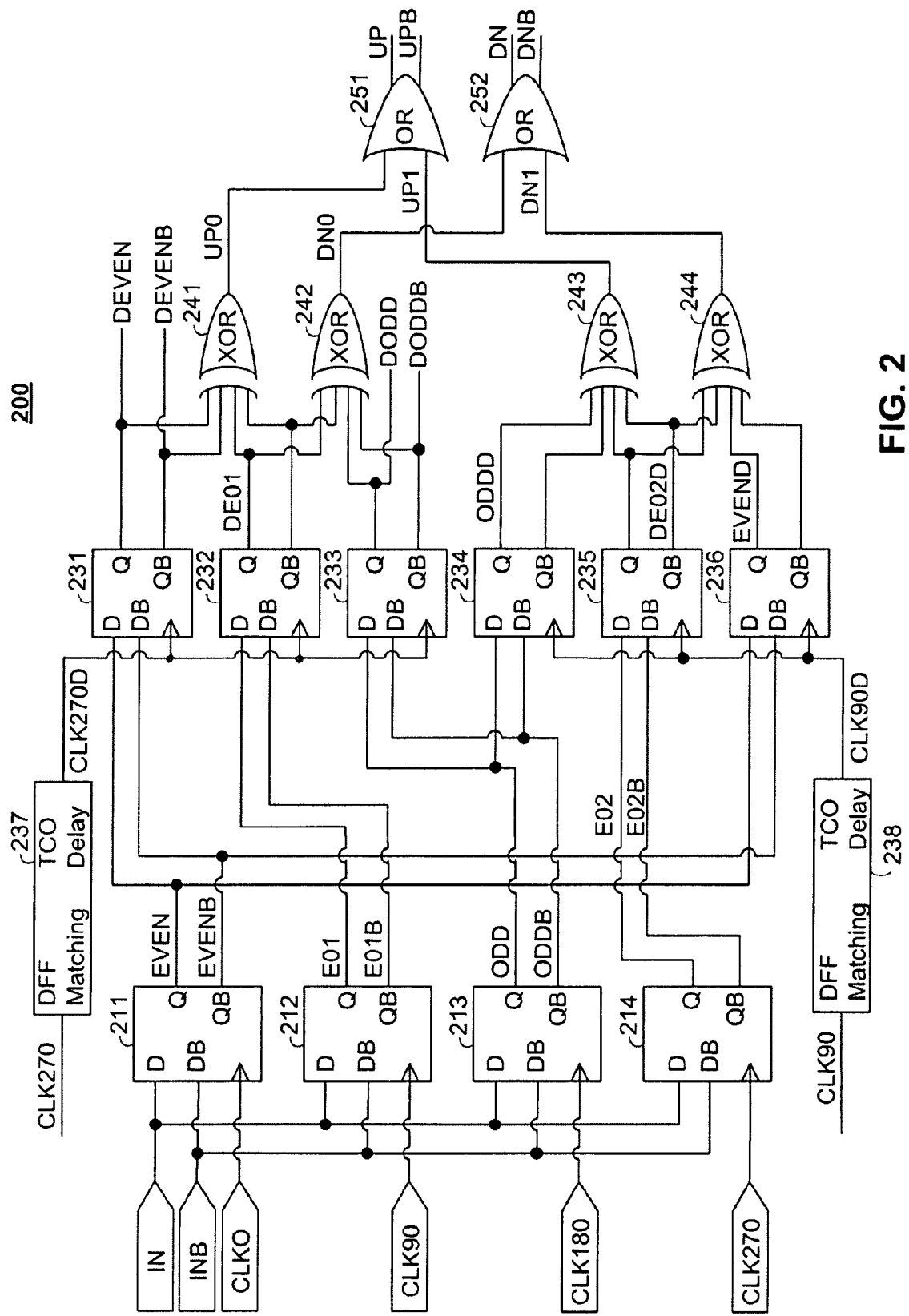
FIG. 2 shows a schematic diagram of a bang-bang phase detector with latency reduction in accordance with the principles of the invention.

FIG. 2 shows a schematic diagram of a bang-bang phase detector (BBPD) circuit 200 having reduced latency as compared to circuit 100. BBPD circuit 200 includes first and second stages of timing circuitry and first and second stages of combinational logic circuitry. Analogously to BBPD circuit 100, circuit 200 produces from differential input signals IN/INB received at differential input nodes two sets, UP/UPB and DN/DNB, of differential output signals used to detect the phase of the input signals. BBPD circuit 200 also functions as an input sampler that produces two sets, DEVEN/DEVENB and DODD/DODDB, of retimed differential output signals which respectively include the even and the odd samples of the input signal.

BBPD circuits 100 and 200 are similar in function and structure. Circuit elements in circuits 100 and 200 that operate in similar ways and have similar functions are numbered correspondingly. For example, matching delays 137 and 138 of circuit 100 operate in a substantially similar manner as matching delays 237 and 238 of circuit 200.

BBPD circuit 200 includes two stages of timing circuitry followed by two stages of combinational logic circuitry. The first stage of timing circuitry of BBPD circuit 200 operates in a manner similar to the first and second stages of timing circuitry of circuit 100. The first stage of timing circuitry of circuit 200 includes four differential flip-flops 211-214 used as sense-amplifiers. Flips-flops 211-214 serve to both boost the differential input signals they receive at their input nodes, and to re-time the input signal samples stored in the flip-flops. Analogously to flip-flops 111-114, flip-flops 211-214 receive at their differential inputs the input signal IN/INB and are timed, respectively, by four different phases CLK0, CLK90, CLK180, and CLK270 of the input clock signal. Each flip-flop 211-214 produces a differential signal at its output nodes.

The second stage of timing circuitry of circuit 200 operates in a manner similar to the third stage of timing circuitry of circuit 100. The second stage of timing circuitry of circuit 200 includes six differential flip-flops 231-236 used to re-synchronize the data signals at the outputs of flip-flops 211-214 using two delay clocks CLK90D and CLK270D. Analogously to flip-flops 131-136 of circuit 100, flips-flops 231-236 re-synchronize data signals for phase comparison and data output to the deserializer. The differential inputs of flip-flops 231 and 236 are coupled to the differential output of flip-flop 211, the input of flip-flop 232 is coupled to the output of flip-flop 212, the inputs of flip-flops 233 and 234 are coupled to the output of flip-flop 213, and the input of flip-flop 235 is coupled to the output of flip-flop 214. Flip-flops 231-233 are timed using the second delay clock signal CLK270D. Flips-flops 234-236 are timed using the first delay clock signal CLK90D.

The first and second stages of combinational circuitry of BBPD circuit 200 are substantially identical to the first and second stages of combinational logic circuitry of circuit 100. The first stage of combinational circuitry includes four XOR gates 241-244 that receive the output signals of flip-flops 231-236 at their input terminals. The second stage of combinational circuitry of circuit 200 includes two OR gates 251-252 that function analogously to OR gates 151-152.

Figure 4:
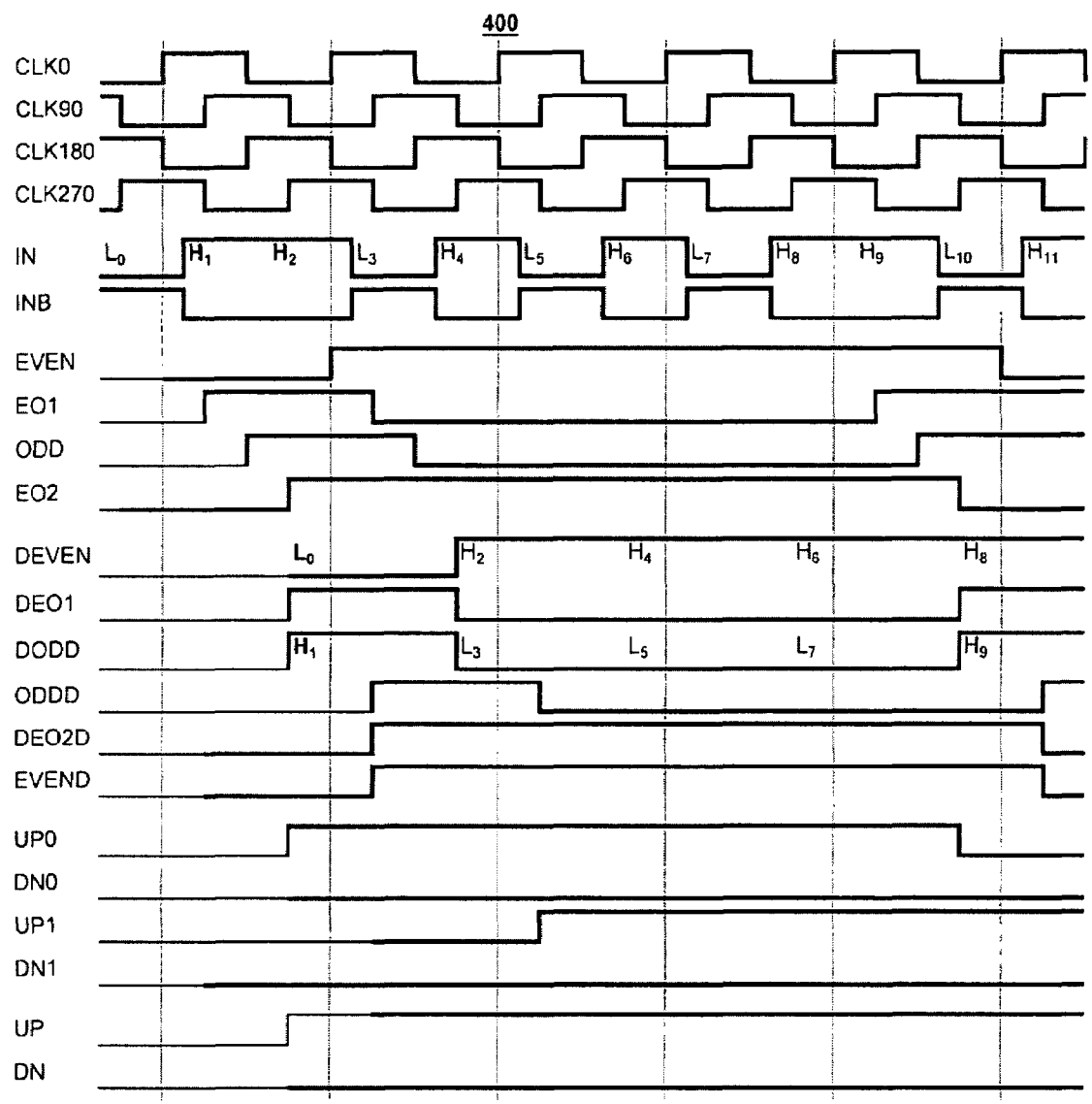
FIG. 4 shows an illustrative timing diagram showing the operation of the circuit of FIG. 2.

FIG. 4 shows an illustrative timing diagram 400 illustrating the operation of BBPD circuit 200. Timing diagram 400 shows the operation of circuit 200 in response to the same differential input signal IN/INB shown in diagram 300. Each signal shown in timing diagram 400 corresponds to the signal traveling on the identically named line in circuit 200. Timing diagram 400 shows the operation of the corresponding circuitry under the same conditions as those described in connection with diagram 300 (i.e., operating conditions in which the timing circuitry has negligible propagation delay, the delayed clock signals CLK90D and CLK270D have the same phase as clock signals CLK90 and CLK270, and inverters have non-negligible propagation delay).

As shown in FIG. 4, each even sample of the input signal propagates to the DEVEN output at least three-quarters of a clock period after the input signal has stabilized at the input of the circuitry (i.e., after at least the delay between a rising edge in CLK0 and the following rising edge in CLK2700D). Similarly, each odd sample of the input signal propagates to the DODD output at least one-quarter of a clock period after the input signal has stabilized at the input of the circuitry (i.e., after at least the delay between a rising edge in CLK180 and the following rising edge in CLK270D). The deserializer circuitry of BBPD circuit 200 thereby presents a latency that is at least one-half period shorter than the latency of a corresponding implementation of BBPD circuit 100.

BBPD circuit 200 may additionally be advantageous because the UP and DN output signals it produces do not suffer from signal jitter. Because flip-flops 231-236 are fully differential, the differential output signals produced by the flip-flops are never equal to each other. The differential signals propagating to the first and second stages of combinational logic circuitry will therefore cause minimal jitter in the combinational logic signals.

Figure 5:
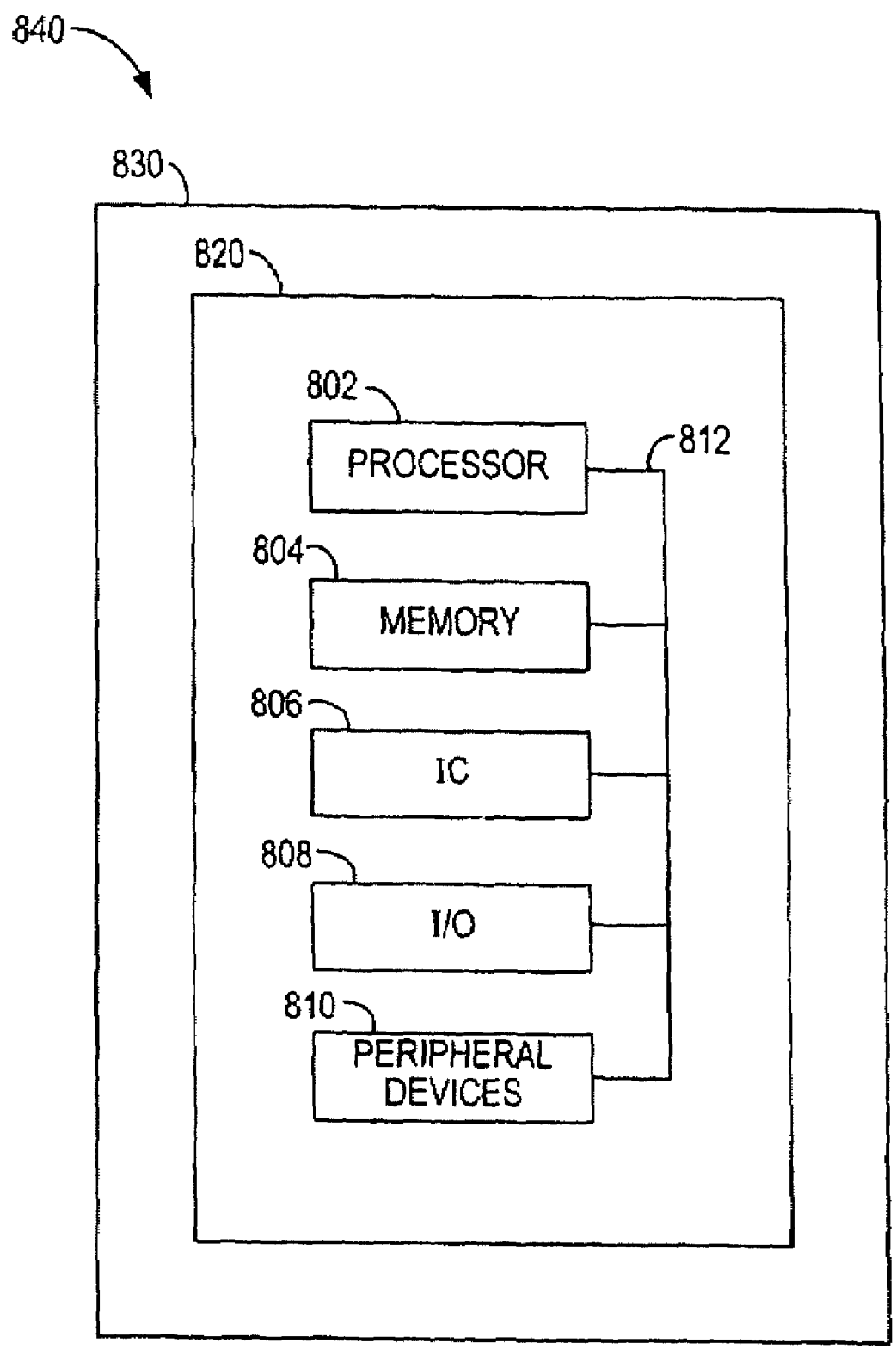
FIG. 5 shows a schematic diagram of an integrated circuit system that may be used in conjunction with the circuitry of FIGS. 1 and 2.

FIG. 5 illustrates an IC 806 which incorporates BBPD methods and apparatus in accordance with this invention in a data processing system 840. IC 806 may be a PLD, an application-specific IC ("ASIC"), or a device possessing characteristics of both a PLD and an ASIC. Data processing system 840 may include one or more of the following components: processor 802; memory 804; I/O circuitry 808; and peripheral devices 810. These components are coupled together by a system bus 812 and are populated on a circuit board 820 which is contained in an end-user system 830. Equalization methods and circuits in accordance with the principles of the invention may be implemented in transceiver circuitry included in I/O circuitry 808, in data processing circuitry, or in other circuitry of system 840.

System 840 can be used in a wide variety of applications, such as receiver and transceiver applications, computer networking, data networking, instrumentation, video processing, or digital signal processing. I/O circuitry 808 can be used to perform a variety of different communication functions. For example, I/O circuitry 808 can be configured to support digital or analog communication with circuit components on circuit board 820, with systems that form part of end-user system 830 or data processing system 840, or with systems external to the end-user system or data processing system.

Methods and circuits are provided for providing high quality, high speed bang-bang phase detection for use in high data-rate applications. One skilled in the art will appreciate that the invention can be practiced by other than the described embodiments, which are presented for purposes of illustration and not of limitation. The invention is limited only by the claims which follow.

What is claimed is:

1. A bang-bang phase detection (BBPD) circuit for use in high data-rate applications, the circuit producing two BBPD output signals each including alternating samples of a BBPD input signal, the circuit comprising:

a first stage of timing circuitry comprising first, second, third, and fourth flip-flops, each flip-flop having an input and an output, each flip-flop receiving at its input the BBPD input signal, and each flip-flop being clocked by a different one of four phases of a common clock signal; and a second stage of timing circuitry comprising first, second, third, fourth, fifth, and sixth flip-flops, each flip-flop having an input coupled to an output of a flip-flop of the first stage of timing circuitry and a differential output, the first and third flip-flops of the second stage producing at their respective outputs first and second BBPD output signals, wherein the first and second BBPD output signals include alternating samples of the BBPD input signal, and wherein the fourth, fifth, and sixth flip-flops of the second stage are clocked by a second clock signal, and wherein the first, second, and third flip-flops of the second stage are clocked by a version of the second clock signal that is delayed by a half period with respect to the second clock signal.

2. The circuit of claim 1, wherein the first flip-flop of the first stage is clocked by the common clock signal, and wherein the second, third, and fourth flip-flops of the first stage are respectively clocked by versions of the common clock signal that are delayed by a quarter, a half, and three-quarters of the clock period with respect to the common clock signal.

3. A digital integrated circuit including the circuitry of claim 1.

4. The circuit of claim 1, wherein the second clock signal corresponds to a delayed version of the common clock signal.

5. The circuit of claim 1, further comprising:

a first stage of combinational logic circuitry comprising first, second, third, and fourth exclusive-OR ("XOR") gates, each XOR gate receiving at its inputs two differential output signals of flip-flops of the second stage of timing circuitry and producing at its output an XOR output signal; and a second stage of combinational logic circuitry comprising first and second OR gates, each OR gate receiving at its inputs two of the XOR output signals, the first and second OR gates producing at their outputs signals indicative of whether the phase of the common clock signal is leading or lagging the phase of the BBPD input signal.

6. The circuit of claim 5, wherein the inputs of the first, second, third, and fourth XOR gates are respectively coupled to the outputs of the first and second, second and third, fourth and fifth, and fifth and sixth flip-flops of the second stage of timing circuitry.

7. The circuit of claim 6, wherein the inputs of the first OR gate are coupled to the outputs of the first and third XOR gates, and the inputs of the second OR gate are coupled to the outputs of the second and fourth XOR gates.

8. A bang-bang phase detection (BBPD) circuit for use in high data-rate applications, the circuit producing two BBPD output signals each including alternating samples of a BBPD input signal, the circuit comprising:

a first stage of timing circuitry comprising first, second, third, and fourth flip-flops, each flip-flop having an input and an output, each flip-flop receiving at its input the BBPD input signal, and each flip-flop being clocked by a different one of four phases of a common clock signal; and a second stage of timing circuitry comprising first, second, third, fourth, fifth, and sixth flip-flops, each flip-flop having an input coupled to an output of a flip-flop of the first stage of timing circuitry and a differential output, the first and third flip-flops of the second stage producing at their respective outputs first and second BBPD output signals, wherein the first and second BBPD output signals include alternating samples of the BBPD input signal, and wherein the inputs of the first, second, third, fourth, fifth, and sixth flip-flops of the second stage are respectively coupled to the outputs of the first, second, third, third, fourth, and first flip-flops of the first stage.

9. A method for performing bang-bang phase detection (BBPD) in high data-rate applications, the method producing two BBPD output signals each including alternating samples of a BBPD input signal, the method comprising:

producing a first set of re-timed samples of the input signal using a first stage of timing circuitry comprising first, second, third, and fourth flip-flops, each flip-flop receiving at its input the BBPD input signal, and each flip-flop being clocked by a different phase of a common clock signal; and producing a second set of re-synchronized samples of the input signal using a second stage of timing circuitry comprising first, second, third, fourth, fifth, and sixth flip-flops, each flip-flop having an input coupled to an output of a flip-flop of the first stage of timing circuitry and a differential output, the first and third flip-flops of the second stage producing at their respective outputs first and second BBPD output signals, wherein the first and second BBPD output signals include alternating samples of the BBPD input signal, and clocking the fourth, fifth, and sixth flip-flops of the second stage with a second clock signal, and clocking the first, second, and third flip-flops of the second stage with a version of the second clock signal that is delayed by a half period with respect to the second clock signal.

10. The method of claim 9, further comprising:
clocking the first flip-flop of the first stage with the common clock signal, and respectively clocking the second, third, and fourth flip-flops of the first stage with versions of the common clock signal that are delayed by a quarter, a half, and three-quarters of the clock period with respect to the common clock signal.

11. The method of claim 9, wherein the second clock signal corresponds to a delayed version of the common clock signal.

12. The method of claim 9, further comprising:
producing a set of XOR output signals using a first stage of combinational logic circuitry comprising first, second, third, and fourth exclusive-OR ("XOR") gates, each XOR gate receiving at its inputs two differential output signals of flip-flops of the second stage of timing circuitry and producing at its output an XOR output signal; and
producing clock lead/lag signals indicative of whether the phase of the common clock signal is leading or lagging the phase of the BBPD input signal, wherein the clock lead/lag signals are produced using a second stage of combinational logic circuitry comprising first and second OR gates, each OR gate receiving at its inputs two of the XOR output signals, the first and second OR gates producing at their outputs the clock lead/lag signals.

13. The method of claim 12, wherein the inputs of the first, second, third, and fourth XOR gates are respectively coupled to the outputs of the first and second, second and third, fourth and fifth, and fifth and sixth flip-flops of the second stage of timing circuitry.

14. The method of claim 13, wherein the inputs of the first OR gate are coupled to the outputs of the first and third XOR gates, and the inputs of the second OR gate are coupled to the outputs of the second and fourth XOR gates.

15. A method for performing bang-bang phase detection (BBPD) in high data-rate applications, the method producing two BBPD output signals each including alternating samples of a BBPD input signal, the method comprising:
producing a first set of re-timed samples of the input signal using a first stage of timing circuitry comprising first, second, third, and fourth flip-flops, each flip-flop receiving at its input the BBPD input signal, and each flip-flop being clocked by a different phase of a common clock signal; and
producing a second set of re-synchronized samples of the input signal using a second stage of timing circuitry comprising first, second, third, fourth, fifth, and sixth flip-flops, each flip-flop having an input coupled to an output of a flip-flop of the first stage of timing circuitry and a differential output, the first and third flip-flops of the second stage producing at their respective outputs first and second BBPD output signals, wherein the first and second BBPD output signals include alternating samples of the BBPD input signal, and, wherein the inputs of the first, second, third, fourth, fifth, and sixth flip-flops of the second stage are respectively coupled to the outputs of the first, second, third, third, fourth, and first flip-flops of the first stage.

16. A clock-data recovery (CDR) circuit for use in high data-rate applications, the circuit producing two CDR output signals indicative of whether a CDR input signal leads or lags a common clock signal, the circuit comprising:
a first stage of timing circuitry comprising first, second, third, and fourth flip-flops, each flip-flop having an input and an output, each flip-flop receiving at its input the CDR input signal, and each flip-flop being clocked by a different one of four phases of the common clock signal;
a second stage of timing circuitry comprising first, second, third, fourth, fifth, and sixth flip-flops, each flip-flop having an input coupled to an output of a flip-flop of the first stage of timing circuitry and a differential output;
a first stage of combinational logic circuitry comprising first, second, third, and fourth exclusive-OR ("XOR") gates, each XOR gate receiving at its inputs two differential output signals of flip-flops of the second stage of timing circuitry and producing at its output an XOR output signal; and
a second stage of combinational logic circuitry comprising first and second OR gates, each OR gate receiving at its inputs two of the XOR output signals, each of the first and second OR gates producing at their output one of the CDR output signals indicative of whether the phase of the common clock signal is leading or lagging the phase of the CDR input signal.

17. The circuit of claim 16, wherein the flip-flops of the second stage of timing circuitry are clocked by a second clock signal that corresponds to a delayed version of the common clock signal.

18. An integrated circuit device including the circuit of claim 16.

19. A bang-bang phase detection (BBPD) circuit comprising:
a first stage of timing circuitry comprising four flip-flops, each first stage flip-flop being clocked by a different phase of a common clock signal, and each first stage flip-flop comprising a first differential output and a first differential input receiving a BBPD input signal;
a second stage of timing circuitry comprising six flip-flops, each second stage flip-flop comprising a second differential input and a second differential output, wherein the second differential input is coupled to a first differential output, and wherein the second differential outputs of the first and third flip-flops of the second stage produce, respectively, first and second BBPD output signals, wherein the first and second BBPD output signals comprise alternating samples of the BBPD input signal;
a first stage of combinational logic circuitry comprising four exclusive-OR ("XOR") gates, each XOR gate receiving two second differential outputs and producing an XOR output signal; and
a second stage of combinational logic circuitry comprising two OR gates, each OR gate receiving two of the XOR output signals and producing phase outputs signals indicative of the phase of the BBPD input signal relative to the common clock signal.

* * * * *